United States Patent
Laitar et al.

(10) Patent No.: US 9,702,046 B2
(45) Date of Patent: Jul. 11, 2017

(54) ELECTROLESS COPPER PLATING COMPOSITIONS

(71) Applicants: Rohm and Haas Electronic Materials LLC, Marlborough, MA (US); Dow Global Technologies LLC, Midland, MI (US)

(72) Inventors: David S. Laitar, Midland, MI (US); Crystal P. L. Li, Tin Shui Wai (HK); Andy Lok-Fung Chow, Tseung Kwan O (HK)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/993,791

(22) Filed: Jan. 12, 2016

(65) Prior Publication Data

US 2016/0122876 A1    May 5, 2016

Related U.S. Application Data

(62) Division of application No. 14/332,326, filed on Jul. 15, 2014.

(51) Int. Cl.
| | |
|---|---|
| *C23C 18/54* | (2006.01) |
| *C23C 18/16* | (2006.01) |
| *H05K 3/00* | (2006.01) |
| *C23C 18/40* | (2006.01) |
| *H05K 3/18* | (2006.01) |
| *H05K 3/42* | (2006.01) |

(52) U.S. Cl.
CPC .......... *C23C 18/40* (2013.01); *C23C 18/1633* (2013.01); *C23C 18/54* (2013.01); *H05K 3/00* (2013.01); *H05K 3/0094* (2013.01); *H05K 3/181* (2013.01); *H05K 3/422* (2013.01)

(58) Field of Classification Search
CPC ... C23C 18/16; C23C 18/1633; C23C 18/164; C23C 18/54; C09K 8/575; C09K 8/54; C09K 8/57; C09K 8/68; H05K 3/00; H05K 3/0094; H05K 3/181
See application file for complete search history.

(56) References Cited

U.S. PATENT DOCUMENTS

| | | |
|---|---|---|
| 3,075,856 A | 1/1963 | Lukes et al. |
| 4,325,990 A | 4/1982 | Ferrier |
| 4,617,205 A | 10/1986 | Darken |
| 4,877,450 A | 10/1989 | Brasch |
| 5,897,692 A | 4/1999 | Kotsuka et al. |
| 6,897,152 B2 | 5/2005 | HanVerbunt |
| 2002/0064592 A1 | 5/2002 | Datta et al. |
| 2006/0130700 A1 | 6/2006 | Reinartz |
| 2007/0099422 A1 | 5/2007 | Wijckoon et al. |
| 2008/0038450 A1 | 2/2008 | Poole et al. |
| 2009/0281267 A1 | 11/2009 | Shimoosako et al. |
| 2013/0264060 A1 | 10/2013 | DeWolf et al. |
| 2014/0303049 A1 | 10/2014 | Holdsworth |

FOREIGN PATENT DOCUMENTS

| | | |
|---|---|---|
| EP | 1681372 A1 | 7/2006 |
| EP | 2604722 A2 | 12/2012 |
| WO | 2012072658 | 7/2012 |
| WO | 2013064823 | 5/2013 |

OTHER PUBLICATIONS

Search report from corresponding Korean 10-2015-0099241 application, dated May 20, 2016.
Search report from corresponding Taiwan 104121990 application, dated May 13, 2016.
Search Report for corresponding European application No. 15174833.2-1359 issued Dec. 4, 2015.
Voltaic Cells, Voltaic Cells.doc, dated Apr. 18, 2008.
Standard Electrode Potentials, http://hyperphysics.phy-astr.gsu.edu/hbase/chemical/electrode.html, dated Jan. 25, 2017.
Oxidizing and Reducing Agents, http://chemed.chem.purdue.edu/genchem/topicreview/bp/ch19/oxred_3.php, dated Jan. 24, 2017.
Search report for corresponding China Application No. 201510404335.4 dated Feb. 8, 2017.

*Primary Examiner* — Khanh T Nguyen
*Assistant Examiner* — Haidung Nguyen
(74) *Attorney, Agent, or Firm* — John J. Piskorski

(57) ABSTRACT

Electroless copper plating baths include alternative reducing agents to the conventional reducing agents currently used in the electroless plating industry. The electroless copper baths are stable and deposit a salmon bright copper deposit on substrates. Exclusion of many environmentally unfriendly conventional reducing agents enables environmentally friendly electroless copper plating baths.

6 Claims, No Drawings

ELECTROLESS COPPER PLATING COMPOSITIONS

The present application is a divisional application of co-pending application Ser. No. 14/332,326 filed Jul. 15, 2014.

FIELD OF THE INVENTION

The present invention is directed to electroless copper plating compositions. More specifically, the present invention is directed to electroless copper plating compositions with reducing agents which are alternatives to conventional reducing agents and which are stable, environmentally friendly and provide good copper deposits.

BACKGROUND OF THE INVENTION

Electroless copper plating compositions are in widespread use in metallization industries for depositing copper on various types of substrates. In the manufacture of printed wiring boards, for example, the electroless copper baths are used to deposit copper into through-holes and circuit paths as a base for subsequent electrolytic copper plating. Electroless copper plating also is used in the decorative plastics industry for deposition of copper onto non-conductive surfaces as a base for further plating of copper, nickel, gold, silver and other metals as required. Typical electroless plating baths which are in commercial use today contain divalent copper compounds, chelating agents or complexing agents for the divalent copper ions, formaldehyde reducing agents and various addition agents to make the bath more stable, adjust the plating rate and brighten the copper deposit. Although many of such baths are successful and are widely used, the metallization industry has been searching for alternative electroless copper plating baths that do not contain formaldehyde due to its toxic nature.

Formaldehyde is known as an eye, nose and upper respiratory tract irritant. Animal studies have shown that formaldehyde is an in vitro mutagen. According to a WATCH committee report (WATCH/2005/06—Working group on Action to Control Chemicals—sub committee with UK Health and Safety Commission) over fifty epidemiological studies have been conducted prior to 2000 suggested a link between formaldehyde and nasopharyngeal/nasal cancer but were not conclusive. However, more recent studies conducted by IARC (International Agency for Research on Cancer) in the U.S.A. showed that there was sufficient epidemiological evidence that formaldehyde causes nasopharyngeal cancer in humans. As a result the INRS, a French agency, has submitted a proposal to the European Community Classification and Labelling Work Group to reclassify formaldehyde from a category 3 to a category 1 carcinogen. This would make usage and handling of it more restricted, including in electroless copper formulations. Accordingly, there is a need in the metallization industry for a comparable or improved reducing agent to replace formaldehyde. Such a reducing agent must be compatible with existing electroless copper processes; provide desired capability and reliability and meet cost targets.

Hypophosphites have been suggested as a replacement for formaldehyde; however, plating rates of baths containing this compound are generally too slow.

U.S. Pat. No. 5,897,692 discloses formaldehyde free electroless plating solutions. Compounds such as boron hydride salts and dimethylamine borane (DMAB) are included as reducing agents. However, such boron containing compounds have been tried with varying degrees of success. Further, these compounds are more expensive than formaldehyde and also have health and safety issues. DMAB is toxic. Additionally, resultant borates have adverse effects on crops on release into the environment.

Accordingly, there is still a need for an electroless copper bath which includes alternative reducing agents to replace many of the conventional reducing agents currently used in the electroless plating industry that is stable, provides acceptable copper deposits and is environmentally friendly.

SUMMARY OF THE INVENTION

A composition includes one or more sources of copper ions, one or more chelating agents and one or more compounds having a formula:

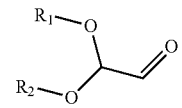

wherein $R_1$ and $R_2$ may be the same or different and are linear or branched $(C_1-C_4)$alkyl.

A method includes: providing a substrate; applying a composition to the substrate, the composition comprises one or more sources of copper ions, one or more chelating agents and one or more compounds having a formula:

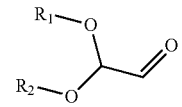

wherein $R_1$ and $R_2$ may be the same or different and are linear or branched $(C_1-C_4)$alkyl.

The electroless copper compositions provide alternative reducing agents which enable the exclusion of many conventional reducing agents and yet are stable during storage as well as during copper deposition. electroless copper compositions provide uniform copper deposits which have a uniform pink and smooth appearance, and generally meet industry standards desired for commercially acceptable electroless copper baths. The electroless copper compositions also plate copper at commercially acceptable rates. Exclusion of conventional environmentally unfriendly reducing agents enables an environmentally friendly electroless copper plating composition.

DETAILED DESCRIPTION OF THE INVENTION

As used throughout this specification, the abbreviations given below have the following meanings, unless the context clearly indicates otherwise: g=gram; mg=milligram; ml=milliliter; L=liter; cm=centimeter; m=meter; mm=millimeter; μm=micron; min.=minute; ppm=parts per million; ° C.=degrees Centigrade; M=molar; g/L=grams per liter; v=volume; wt %=percent by weight; DI=deionized; $T_g$=glass transition temperature.

The terms "printed circuit board" and "printed wiring board" are synonymous. The terms "plating" and "deposition" are used interchangeably throughout this specification. All amounts are percent by weight, unless otherwise noted.

All numerical ranges are inclusive and combinable in any order except where it is logical that such numerical ranges are constrained to add up to 100%.

Electroless copper compositions are stable during storage and during electroless copper deposition. The compositions provide a copper deposit with a uniform salmon pink appearance. The electroless copper compositions may exclude many environmentally unfriendly reducing agents thus enabling an environmentally friendly electroless copper plating composition. The compositions include one or more sources of copper ions, one or more chelating agents and one or more compounds having formula:

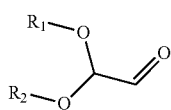

wherein $R_1$ and $R_2$ are the same or different and include linear or branched $(C_1-C_4)$alkyl. Such compounds include 2,2-dimethoxyacetaldehyde, 2,2-diethoxyacetaldehyde, 2,2-dipropoxyacetaldehyde and 2,2-dibutoxyacetaldehyde. Preferably the compound is 2,2-dimethoxyacetaldehyde. Such compounds function as reducing agents. They may be included in the electroless copper plating compositions in amounts of at least 0.5 g/L, preferably from 1 g/L to 50 g/L, more preferably from 5 g/L to 30 g/L.

Sources of copper ions include, but are not limited to, water soluble halides, nitrates, acetates, sulfates and other organic and inorganic salts of copper. Mixtures of one or more of such copper salts may be used to provide copper ions. Examples include copper sulfate, such as copper sulfate pentahydrate, copper chloride, copper nitrate, copper hydroxide and copper sulfamate. Conventional amounts of copper salts may be used in the compositions. One or more sources of copper ions may be included in the composition to provide copper ion concentrations in amounts of at least 0.5 g/L, preferably from 1 g/L to 30 g/L, more preferably from 1 g/L to 20 g/L.

One or more chelating agents are included in the composition. Chelating agents include, but are not limited to: organic acids such as carboxylic acids and salts thereof. Such carboxylic acids include, but are not limited to: tartaric acid, citric acid, acetic acid, malic acid, malonic acid, ascorbic acid, oxalic acid, lactic acid, succinic acid and salts thereof. Such salts include alkali metal salts of the organic acids such as Rochelle salts which include potassium sodium tartrate, and dipotassium tartrate. Chelating agents may also include one or more of hydantoin and hydantoin derivatives such as 1-methylhydantoin, 1,3-dimethylhydantoin and 5,5-dimethylhydantoin, nitriloacetic acid and its alkali metal salts, triethanolamine, ethylenediaminetetraacetic acid (EDTA) and its alkali metal salts such as tetrasodium ethylenediaminetetraacetate, modified ethylene diamine tetraacetic acids such as N-hydroxyethylenediamine triacetate, hydroxyalkyl substituted dialkaline triamines such as pentahydroxy propyldiethylenetriamine and compounds such as N, N-dicarboxymethyl L-glutamic acid tetrasodium salt, S,S-ethylene diamine disuccinic acid and N,N,N',N'-tetrakis (2-hydroxypropyl) ethytlenediamine (ethylenedinitrilo)tetra-2-propanol. Preferably the chelating agents are organic diprotic acids and salts thereof, more preferably the chelating agents are the salts of organic diprotic acids, most preferably the chelating agents are Rochelle salts, dipotassium tartrate or mixtures thereof.

Chelating agents may be included in the compositions in amounts of at least 0.5 g/L, preferably from 1 g/L to 150 g/L, more preferably from 10 g/L to 100 g/L, most preferably from 15 g/L to 50 g/L.

One or more compounds which provide an alkaline composition within the desired pH range may be used. Alkaline compounds include, but are not limited to, one or more alkaline hydroxides such as sodium hydroxide, potassium hydroxide and lithium hydroxide. Typically sodium hydroxide, potassium hydroxide or mixtures thereof are used. Such alkaline compounds may be included in amounts to provide a pH range of 8 and greater, preferably the pH is 10 to 14, more preferably the pH is from 11 to 13.5.

Other additives may be included in the electroless copper compositions to tailor the compositions to a desired plating performance for a given application. Many of such additives are well known in the art. Such additives include, but are not limited to: surfactants, additional reducing agents, antioxidants, stabilizers and surface modifiers.

Conventional surfactants may be included in the compositions. Such surfactants include ionic, such as cationic and anionic surfactants, non-ionic and amphoteric surfactants. Mixtures of the surfactants may be used. In general, surfactants may be included in conventional amounts for electroless copper plating compositions. Surfactants may be included in the compositions in amounts of 0.001 g/L to 50 g/L.

Cationic surfactants include, but are not limited to: tetraalkylammonium halides, alkyltrimethylammonium halides, hydroxyethyl alkyl imidazoline, alkylbenzalkonium halides, alkylamine acetates, alkylamine oleates and alkylaminoethyl glycine.

Anionic surfactants include, but are not limited to: alkylbenzenesulfonates, alkyl or alkoxy naphthalene sulfonates, alkyldiphenyl ether sulfonates, alkyl ether sulfonates, alkylsulfuric esters, polyoxyethylene alkyl ether sulfuric esters, polyoxyethylene alkyl phenol ether sulfuric esters, higher alcohol phosphoric monoesters, polyoxyalkylene alkyl ether phosphoric acids (phosphates) and alkyl sulfosuccinates.

Amphoteric surfactants include, but are not limited to: 2-alkyl-N-carboxymethyl or ethyl-N-hydroxyethyl or methyl imidazolium betaines, 2-alkyl-N-carboxymethyl or ethyl-N-carboxymethyloxyethyl imidazolium betaines, dimethylalkyl betains, N-alkyl-β-aminopropionic acids or salts thereof and fatty acid amidopropyl dimethylaminoacetic acid betaines.

Preferably the surfactants are non-ionic. Non-ionic surfactants include, but are not omitted to: are alkyl phenoxy polyethoxyethanols, polyoxyethylene polymers having from 20 to 150 repeating units and block and random copolymers of polyoxyethylene and polyoxypropylene.

Optionally, one or more conventional reducing agents may be included in the compositions. Such conventional reducing agents include, but are not limited to: hypophosphite salts such as alkali metal hypophosphites such as sodium hypophosphite, sulfinate compounds such as sodium hydroxymethanesulfinate. Reducing agents also may include glyoxylic acid, formaldehyde, boron hydride salts and dimethylamine borane. Such conventional reducing agents are included in conventional amounts, preferably they are included in amounts of 1 g/L and greater, more preferably from 5 g/L to 20 g/L. Preferably the electroless copper plating compositions are free of glyoxylic acid and environmentally unfriendly reducing agents. Most preferably, the electroless plating copper plating compositions are free of environmentally unfriendly reducing agents such as formaldehyde, boron hydride salts and dimethylamine borane (DMAB).

Antioxidants include, but are not limited to: monohydric, dihydric and trihydric phenols in which a hydrogen atom or atoms may be unsubstituted or substituted by —COOH, —SO$_3$H, lower alkyl or lower alkoxy groups, hydroquinone, catechol, resorcinol, quinol, pyrogallol, hydroxyquinol, phloroglucinol, guaiacol, gallic acid, 3,4-dihydroxybenzoic acid, phenolsulfonic acid, cresolsulfonic acid, hydroquinonsulfonic acid, catecholsulfonic acid and salts thereof. Antioxidants may be included in the compositions in conventional amounts typically used for electroless copper compositions.

Other optional additives include those compounds which may further stabilize the compositions and modify the surface appearance of the copper deposit. Such compounds include, but are not limited to: sulfur containing compounds such as mercaptosuccinic acid, dithiodisuccinic acid, mercaptopyridine, mercaptobenzothiazole, thiourea and thiourea derivatives; compounds such as pyridine, purine, quinoline, indole, indazole, imidazole, pyrazine and their derivatives; alcohols such as alkyne alcohols, allyl alcohols, aryl alcohols and cyclic phenols; hydroxy substituted aromatic compounds such as methyl-3,4,5-trihydroxybenzoate, 2,5-dihydroxy-1,4-benzoquinone and 2,6-dihydroxynaphthalene; amines; amino acids; aqueous soluble metal compounds such as metal chlorides and sulfates; silicon compounds such as silanes, siloxanes and low to intermediate molecular weight polysiloxanes; germanium and its oxides and hydrides; and polyalkylene glycols, cellulose compounds, alkylphenyl ethoxylates and polyoxyethylene compounds; and stabilizers such as pyridazine, methylpiperidine, 1,2-di-(2-pyridyl)ethylene, 1,2-di-(pyridyl)ethylene, 2,2'-dipyridylamine, 2,2'-bipyridyl, 2,2'-bipyrimidine, 6,6'-dimethyl-2,2'-dipyridyl, di-2-pyrylketone, N,N,N',N'-tetraethylenediamine, naphthalene, 1,8-naphthyridine, 1,6-naphthyridine, tetrathiafurvalene, terpyridine, pththalic acid, isopththalic acid and 2,2'-dibenzoic acid. Such additives may be included in the electroless copper compositions in amounts of 0.01 ppm to 1000 ppm, preferably from 0.05 ppm to 10 ppm.

The electroless copper compositions may be used to deposit a copper on both conductive and non-conductive substrates. The electroless compositions may be used in many conventional methods known in the art. Typically copper deposition is done at temperatures of 20° C. to 80° C. Preferably the electroless compositions deposit copper at temperatures of 30° C. to 60° C. The substrate to be plated with copper is immersed in the electroless composition or the electroless composition is sprayed onto the substrate. Conventional plating times may be used to deposit the copper onto the substrate. Deposition may be done for 5 seconds to 30 minutes; however, plating times may vary depending on the thickness of the copper desired on the substrate and the plating bath temperature. Copper plating rates may range from 0.01 μm/10 minutes to 1 μm/10 minutes.

Substrates include, but are not limited to: materials including inorganic and organic substances such as glass, ceramics, porcelain, resins, paper, cloth and combinations thereof. Metal-clad and unclad materials also are substrates which may be plated with the electroless copper compositions.

Substrates also include printed circuit boards. Such printed circuit boards include metal-clad and unclad with thermosetting resins, thermoplastic resins and combinations thereof, including fiber, such as fiberglass, and impregnated embodiments of the foregoing.

Thermoplastic resins include, but are not limited to: acetal resins, acrylics, such as methyl acrylate, cellulosic resins, such as ethyl acetate, cellulose propionate, cellulose acetate butyrate and cellulose nitrate, polyethers, nylon, polyethylene, polystyrene, styrene blends, such as acrylonitrile styrene and copolymers and acrylonitrile-butadiene styrene copolymers, polycarbonates, polychlorotrifluoroethylene, and vinylpolymers and copolymers, such as vinyl acetate, vinyl alcohol, vinyl butyral, vinyl chloride, vinyl chloride-acetate copolymer, vinylidene chloride and vinyl formal.

Thermosetting resins include, but are not limited to: allyl phthalate, furane, melamine-formaldehyde, phenol-formaldehyde and phenol-furfural copolymers, alone or compounded with butadiene acrylonitrile copolymers or acrylonitrile-butadiene-styrene copolymers, polyacrylic esters, silicones, urea formaldehydes, epoxy resins, allyl resins, glyceryl phthalates and polyesters.

Porous materials include, but are not limited to: paper, wood, fiberglass, cloth and fibers, such as natural and synthetic fibers, such as cotton fibers and polyester fibers.

The electroless copper compositions may be used to plate both low and high $T_g$ resins. Low $T_g$ resins have a $T_g$ below 160° C. and high $T_g$ resins have a $T_g$ of 160° C. and above. Typically high $T_g$ resins have a $T_g$ of 160° C. to 280° C. or such as from 170° C. to 240° C. High $T_g$ polymer resins include, but are not limited to: polytetrafluoroethylene (PTFE) and polytetrafluoroethylene blends. Such blends include, for example, PTFE with polypheneylene oxides and cyanate esters. Other classes of polymer resins which include resins with a high $T_g$ include, but are not limited to: epoxy resins, such as difunctional and multifunctional epoxy resins, bimaleimide/triazine and epoxy resins (BT epoxy), epoxy/polyphenylene oxide resins, acrylonitrile butadienestyrene, polycarbonates (PC), polyphenylene oxides (PPO), polypheneylene ethers (PPE), polyphenylene sulfides (PPS), polysulfones (PS), polyamides, polyesters such as polyethyleneterephthalate (PET) and polybutyleneterephthalate (PBT), polyetherketones (PEEK), liquid crystal polymers, polyurethanes, polyetherimides, epoxies and composites thereof.

The electroless compositions may be used to deposit copper on walls of through-holes or vias of printed circuit board substrates as well as other parts of the boards. The electroless compositions may be used in both horizontal and vertical processes of manufacturing printed circuit boards.

In general, the boards may be rinsed with water and cleaned and degreased followed by desmearing the through-hole walls. Typically prepping or softening the dielectric or desmearing of the through-holes begins with application of a solvent swell. Any conventional solvent swell may be used. The specific type may vary depending on the type of dielectric material. Minor experimentation may be done to determine which solvent swell is suitable for a particular dielectric material. Solvent swells include, but are not limited to: glycol ethers and their associated ether acetates. Examples of commercially available solvent swells are CIRCUPOSIT™ Conditioner 3302A, CIRCUPOSIT™ Hole Prep 3303 and CIRCUPOSIT™ Hole Prep 4120 solutions (available from Dow Electronic Materials).

After the solvent swell, a promoter may be applied. Conventional promoters may be used. Such promoters include sulfuric acid, chromic acid, alkaline permanganate or plasma etching. Typically alkaline permanganate is used as the promoter. Examples of commercially available promoters are CIRCUPOSIT™ Promoter 4130 and CIRCU- POSIT™ MLB Promoter 3308 solutions (available from Dow Electronic Materials). Optionally, the substrate and through-holes are rinsed with water.

A neutralizer may then be applied to neutralize any residues left by the promoter. Conventional neutralizers may be used. Typically the neutralizer is an aqueous acidic solution containing one or more amines or a solution of 3 wt % hydrogen peroxide and 3 wt % sulfuric acid. An example of a commercially available neutralizer is CIRCUPOSIT™ MLB Neutralizer 216-5. Optionally, the substrate and through-holes are rinsed with water and then dried.

After neutralizing an acid or alkaline conditioner is applied. Conventional conditioners may be used. Such conditioners may include one or more cationic surfactants, non-ionic surfactants, complexing agents and pH adjusters or buffers. Examples of commercially available acid conditioners are CIRCUPOSIT™ Conditioners 3320A and 3327 solutions (available from Dow Electronic Materials). Suitable alkaline conditioners include, but are not limited to: aqueous alkaline surfactant solutions containing one or more quaternary amines and polyamines Examples of commercially available alkaline surfactants are CIRCUPOSIT™ Conditioner 231, 3325, 813 and 860 formulations. Optionally, the substrate and through-holes are rinsed with water.

Conditioning may be followed by micro-etching. Conventional micro-etching compositions may be used. Micro-etching is designed to provide a micro-roughened metal surface on exposed metal (e.g. innerlayers and surface etch) to enhance subsequent adhesion of plated electroless metal and later electroplate. Micro-etches include, but are not limited to: 60 g/L to 120 g/L sodium persulfate or sodium or potassium oxymonopersulfate and sulfuric acid (2%) mixture, or generic sulfuric acid/hydrogen peroxide. Examples of commercially available micro-etching compositions are CIRCUPOSIT™ Microetch 3330 Etch solution and PREP-OSIT™ 748 Etch solution (available from Dow Electronic Materials). Optionally, the substrate is rinsed with water.

Optionally, a pre-dip may then applied to the micro-etched substrate and through-holes. Pre-dips include, but are not limited to: organic salts such as sodium potassium tartrate or sodium citrate, 0.5% to 3% sulfuric acid or an acidic solution of 25 g/L to 75 g/L sodium chloride.

A catalyst may then be applied to the substrate. Conventional catalysts may be used such as conventional tin/palladium colloidal catalysts. Commercially available catalysts include, but are not limited to: CATAPOSIT™ 44 and CATAPOSIT™ 404 catalyst formulations (available from Dow Electronic Materials). Application may be done by conventional methods used in the art, such as immersing the substrate in a solution of the catalyst or by spraying or by atomization using conventional apparatus. Catalyst dwell time may range from 1 minute to 10 minutes, typically from 2 minutes to 8 minutes for vertical equipment and for 25 seconds to 120 seconds for horizontal equipment. The catalysts may be applied at temperatures from room temperature to 80° C., typically from 30° C. to 60° C. The substrate and through-holes optionally may be rinsed with water after application of the catalyst.

The substrate and walls of the through-holes are then electrolessly plated with copper using the electroless copper composition. Plating times and temperatures may be conventional. Typically copper deposition may be done at temperatures of 20° C. to 80° C., more typically from 30° C. to 60° C. The substrate may be immersed in the electroless plating composition or the electroless composition may be sprayed onto the substrate. Typically, electroless plating may be done for 5 seconds to 30 minutes; however, plating times may vary depending on the thickness of the metal desired. Plating is done in an alkaline environment to prevent undesired corrosion of any metal cladding on the substrate.

Optionally anti-tarnish may be applied to the metal. Conventional anti-tarnish compositions may be used. An example of anti-tarnish is ANTI TARNISH™ 7130 solution (available from Dow Electronic Materials). The substrate may optionally be rinsed with water and then the boards may be dried.

After the substrate is plated with copper, the substrates may undergo further processing. Further processing may include conventional processing by photoimaging and further metal deposition on the substrates such as electrolytic metal deposition of, for example, copper, copper alloys, tin and tin alloys.

The electroless copper compositions provide alternative reducing agents which enable the exclusion of many conventional reducing agents and yet are stable during storage as well as during copper deposition. Failure to observe copper oxide formation is one indication of composition stability. Additionally, reductant stability can be assessed by examining the plating rates of compositions before and after idling for several hours. For a composition that is stable, substantially the same plating rates are observed before and after idling. The electroless copper compositions provide uniform copper deposits which have a substantially uniform pink and smooth appearance, and generally meet industry standards desired for commercially acceptable electroless copper baths. The electroless copper compositions also plate copper at commercially acceptable rates. Exclusion of conventional environmentally unfriendly reducing agents enables an environmentally friendly electroless copper plating composition.

The following examples are not intended to limit the scope of the invention but to further illustrate it.

Example 1

Unclad epoxy/glass laminates with dimensions 5 cm×5 cm provided by Sheng Yi (S1141) were used in plating tests for deposition rate measurement and coverage examination. Each laminate was treated as follows:

1. The surface of each laminate was immersed in an aqueous bath containing 3% CIRCUPOSIT™ CONDITIONER 3323A formulation for 5 minutes at 40° C.
2. Each laminate was then rinsed with cold water for 4 minutes at 22° C.
3. CATAPOSIT™ 404 pre-dip was then applied to each laminate for 1 minute at room temperature.
4. The laminates were then activated for 5 minutes at 40° C. with a 2% CATAPOSIT™ 44 and CATAPOSIT™ 404 palladium/tin catalyst bath for electroless copper metallization.
5. The laminates were then rinsed with cold water for 2 minutes.
6. Each laminate was then immersed in an aqueous electroless copper plating composition of formulation 1: 2 g/L copper ions from copper chloride dihydrate (5.8 g/L), 4 equivalents of dipotassium tartrate (32 g/L), 0.1M 2,2-dimethoxyacetaldehyde (60 wt % aqueous) (10.4 g/L) and potassium hydroxide to maintain pH=13, or composition of formulation 2: 2 g/L copper ions from copper chloride dihydrate (5.8 g/L), 4 equivalents Rochelle salt (35 g/L), 0.1M 2,2-dimethoxyacetaldehyde (60 wt % aqueous) (10.4 g/L), potassium hydroxide to maintain pH=13.
7. Each laminate was copper plated for 5 minutes at 40° C., 45° C. or 50° C. with air agitation. No copper oxide red precipitate was observed in either solution during copper deposition. The baths appeared stable.

8. Each copper plated laminate was then rinsed with cold water for 2 minutes.
9. Each copper plated laminate was then rinsed with deionized water for 1 minute.
10. Each copper plated laminate was then placed in a conventional laboratory convection oven and dried for 15 minutes at 100° C.
11. After drying, each copper plated laminate was placed in a conventional laboratory dessicator for 25 minutes or until it cooled to room temperature.
12. After drying each copper plated laminate was observed for the quality of the copper deposit. Each laminate had a salmon pink copper deposit.
13. The copper deposit was then etched from each laminate by immersion in an ammonium chloride buffer of pH 10 and 3% hydrogen peroxide solution. The resulting clear blue copper (II) solution was collected.
14. Several drops of 5% 1-(2-pyridylazol)-2-naphthol (PAN) indicator were added to the copper (II) solution, which was then titrated with 0.05M ethylenediamine tetraacetic acid solution. The volume in mL of the 0.05M ethylenediamine tetraacetic acid solution added was recorded.
15. The copper deposition rate was calculated with the following formula: $[(0.05M)(V\ mL)(10^{-3})(63.546\ g/mole)](10^4)(1/8.94\ g/cm^3)(1/2S\ cm^2)$ in units of $\mu m/$(plating time) where V=volume of 0.05M ethylenediamine tetraacetic acid, molecular weight of copper is 63.546 g/mole, 8.94 g/cm$^3$ is the density of copper and S=surface area of the laminate in cm$^2$ which was 5 cm×5 cm, $10^{-3}$ is the conversion factor of L to mL and $10^4$ is the conversion factor of cm to $\mu m$.

TABLE 1

| Formulation | Temperature ° C. | 5 Minute Plating Thickness in μm |
|---|---|---|
| 1 | 40 | 0.26 |
| 1 | 45 | 0.37 |
| 1 | 50 | 0.48 |
| 2 | 40 | 0.36 |
| 2 | 45 | 0.36 |
| 2 | 50 | 0.59 |

Except for formulation 1 at 40° C. the plating rates all exceeded the target plating rate of 0.3 μm per 5 minutes which indicated their acceptability for commercial purposes.

Example 2

Twelve pre-drilled multi-layer copper clad epoxy/glass laminates of the type Shengyi-1141 were provided. The dimensions of the laminates were 2 cm×3.2 cm. The boards were processed through the work-flow described below.

1. The surface of each through-hole laminate was immersed in an aqueous bath of 11.5% CUPOSIT™ Z sweller and 12.5% CIRCUPOSIT™ HOLE PREP 211 formulation for 5 minutes at 75° C.
2. Each laminate was then rinsed with water for 3 minutes at 22° C.
3. 15% CUPOSIT™ Z and 10% CIRCUPOSIT™ 213A-1 oxidizer were then applied to each through-hole laminate for 10 minutes at 80° C.
4. Each oxidized laminate was then rinsed with water for 3 minutes at 22° C.
5. The oxidized through-hole laminates were then rinsed with 5% CIRCUPOSIT™ NEUTRALIZER 216-5 aqueous neutralizer for 5 minutes at 40° C.
6. The laminates are then rinsed with water for 3 minutes at 22° C.
7. The laminates were then immersed in 3% CIRCUPOSIT™ CONDITIONER 3323A aqueous bath for 5 minutes at 40° C.
8. The treated laminates were then rinsed with water for 4 minutes at 22° C.
9. Each laminate was then dipped in an acidic microetch bath containing 2% sulfuric acid and sodium persulfate with a concentration at 100 g/L for 1 minute and then rinsed with water at 22° C. for 3 minutes.
10. CATAPOSIT™ 404 pre-dip was then applied to each laminate for 1 minute at room temperature.
11. The laminates were then primed for 5 minutes at 40° C. with 2% CATAPOSIT™ and CATAPOSIT™ 404 tin/palladium colloidal catalysts.
12. The laminates were then rinsed with water at 22° C. for 2 minutes.
13. Each laminate was then electroless plated with either composition of formulation A: 2 g/L copper ions from copper chloride dihydrate (5.8 g/L), 4 equivalents of dipotassium tartrate (32 g/L), 0.1M 2,2-dimethoxyacetaldehyde (60 wt % aqueous) (10.4 g/L) and potassium hydroxide to maintain pH=13, or composition of formulation B: 2 g/L copper ions from copper chloride dihydrate (5.8 g/L), 4 equivalents Rochelle salt (35 g/L), 0.2M 2,2-dimethoxyacetaldehyde (60 wt % aqueous) (20.8 g/L), potassium hydroxide to maintain pH=13 at varying temperatures and for 5 minutes or 10 minutes as shown in table 2 below. During copper plating, no copper oxide red precipitate was observed indicating that the plating baths were stable.

TABLE 2

| Formulation | Temperature ° C. | 5 Minute Plating Thickness in μm | 10 Minute plating Thickness in μm | Uniform Through-Hole Coverage After 10 Minutes |
|---|---|---|---|---|
| A | 40 | 0.26 | 0.42 | Yes |
| A | 45 | 0.37 | 0.50 | Yes |
| A | 50 | 0.48 | 0.76 | Yes |
| B | 40 | 0.35 | 0.53 | Yes |
| B | 45 | 0.40 | 0.69 | Yes |
| B | 50 | 0.58 | 0.89 | Yes |

14. Each plated laminate was then rinsed with water at 22° C. for 2 minutes followed by rinsing with DI water for 1 minute.
15. The copper plated laminates were then rinsed with cold water for 2 minutes.
16. Each copper plated laminate was then rinsed with deionized water for one minute.
17. The laminates were then placed in a conventional laboratory convection oven and dried for 15 minutes at 100° C.
18. After drying each copper plated laminate was placed in a conventional laboratory dessicator for 25 minutes or until it cooled to room temperature.
19. The appearance of the copper deposits was then inspected and all had a salmon pink appearance.

Samples of the laminates which were copper plated for 10 minutes were ground using a conventional grinding process to expose the middle of the through-holes and mounted on a light microscope for inspection of the copper coverage throughout the through-holes. A total of ten through-holes were inspected for each of the samples taken. All showed complete uniform copper coverage as indicated in Table 2. The rate of copper deposit for each time and temperature as shown in Table 2 was determined by the same method as described in Example 1 above.

Example 3

A plurality of unclad epoxy/glass S1141 laminates with dimensions 5 cm×5 cm were used in plating tests to compare the stability of electroless copper plating baths containing 2,2-dimethoxyacetaldehyde as a reducing agent with either dipotassium tartrate or Rochelle salt as a copper chelating agent versus the stability of formaldehyde alternative reductant glyoxylic acid with dipotassium tartrate.

The laminates were prepared for copper electroless plating as described in Example 1 above. The two electroless formulations which included 2,2-dimethoxyacetaldehyde had the formulations as in Example 2. The comparative glyoxylic acid formulation C included 2 g/L copper ions from copper chloride dihydrate (5.8 g/L), 4 equivalents of dipotassium tartrate (32 g/L), 0.1M glyoxylic acid (7.4 g/L) and potassium hydroxide in amounts to maintain a pH=13. The plating rate was determined by the method described in Example 1 for a 5 minute plating time. Plating was done at 40° C. The bath idle times prior to plating were from 1 to 6 hours. The formulations were not replenished during the idle bath times. The results are shown in Table 3 below.

TABLE 3

| Formulation | Bath Idle Time in Hours | 5 minute Plating Thickness in μm |
| --- | --- | --- |
| A | 1 | 0.33 |
| A | 2 | 0.34 |
| A | 4 | 0.30 |
| A | 6 | 0.29 |
| B | 1 | 0.40 |
| B | 2 | 0.35 |
| B | 4 | 0.38 |
| B | 6 | 0.34 |
| C | 1 | 0.65 |
| C | 2 | 0.57 |
| C | 4 | 0.41 |
| C | 6 | 0.14 |

The copper deposits for all of the formulations appeared salmon pink. Although the glyoxylic acid formulation initially had a higher plating rate than the two plating baths which included 2,2-dimethoxyacetaldehyde, significant drop off in plating rate as well as the thickness of the copper deposit was observed for comparative formulation C relative to formulations A and B. The reduction in plating rate of formulation C may have been due to decomposition reactions of glyoxylic acid, such as the Cannizzaro reaction. In addition, skip plating was observed after 4 hours of ide time for formulation C. Skip plating was noted for formulation A at around 6 hours idle time. There was no indication of skip plating for formulation B. Accordingly, formulations A and B had improved copper plating bath stability in contrast to formulation C which included glyoxylic acid.

Example 4

A plurality of S1141 copper clad epoxy/glass laminates 2 cm×3.2 cm with through-holes were prepared for copper plating as described in Example 2 above. The through-holes of each laminate were plated using one of four formulations shown in Table 4.

TABLE 4

| Formulation | 2,2-dimethoxy-acetaldehyde (g/L) | Copper Chloride Dihydrate (g/L) | Rochelle Salt (g/L) | Dipotassium Tartrate (g/L) |
| --- | --- | --- | --- | --- |
| D | 10.4 | 5.76 | 35 | 0 |
| E | 10.4 | 5.76 | 0 | 32 |
| F | 20.8 | 5.76 | 35 | 0 |
| G | 20.8 | 5.76 | 0 | 32 |

The pH of each formulation was maintained at 13 with potassium hydroxide. The laminates were copper plated with one of formulation D-G at 40° C. for either 5 minutes or 10 minutes. The plating rates were determined according to the method described in Example 1. The plating rates are in Table 5 below. During plating there was no observable copper oxide formation.

Backlight analysis was done for each laminate. Each laminate was cross-sectioned nearest to the centers of the through-holes to expose the copper plated walls. The cross-sections, no more than 3 mm thick from the center of the through-holes, were taken from each panel to determine the through-hole wall coverage. The European Backlight Grading Scale was used. The cross-sections from each panel were placed under a conventional optical microscope of 50× magnification with a light source behind the samples. The quality of the copper deposits was determined by the amount of light visible under the microscope that was transmitted through the sample. Transmitted light was only visible in areas of the plated through-holes where there was incomplete electroless coverage. If no light was transmitted and the section appeared completely black, it was rated a 5 on the backlight scale indicating complete copper coverage of the through-hole wall. If light passed through the entire section without any dark areas, this indicated that there was very little to no copper metal deposition on the walls and the section was rated 0. If sections had some dark regions as well as light regions, they were rated between 0 and 5. A minimum of ten through-holes were inspected and rated for each laminate. The average backlight values for each formulation are in Table 5.

TABLE 5

| Formulation | Plating Rate (5 minutes) μm | Backlight (5 minutes) | Plating Rate (10 minutes) μm | Backlight (10 minutes) |
| --- | --- | --- | --- | --- |
| D | 0.36 | 2.5 | 0.54 | 4.5 |
| E | 0.26 | 2.5 | 0.42 | 4.5 |
| F | 0.47 | 4.25 | 0.68 | 4.5 |
| G | 0.53 | 3.25 | 0.53 | 4.5 |

With the exception of formulation E at 5 minutes, all of the plating rates showed promise for commercial application. Formulations F and G where the concentration of 2,2-dimethoxy-acetaldehyde was 20.8 g/L had the best backlight results at 5 and 10 minute plating times. The target backlight of 4.25 and greater was met by formulation F at the 5 minute plating time and by all four formulations for the 10 minute plating time.

Example 5

An electroless copper plating formulation was prepared as shown in the table below.

TABLE 6

| COMPONENT | AMOUNT |
|---|---|
| Copper Chloride Dihydrate | 5.8 g/L |
| Rochelle Salt | 43 g/L |
| 2,2-dimethoxyacetaldehyde | 15.6 g/L |
| Sodium Hypophosphite | 15 g/L |
| 2,2'-dipyridyl | 2 ppm |
| 2-mercaptobenzothiazole | 0.25 ppm |

Sufficient potassium hydroxide was added to the formulation to maintain a pH of 13.

A plurality of S1141 copper clad epoxy/glass laminates 2 cm×3.2 cm with through-holes were prepared for copper plating as described in Example 2 above. The laminates were immersed in the plating formulation for 10 minutes at 37° C. No copper oxide formation was observed during plating. The formulation remained stable. After plating each laminate was then rinsed with water at 22° C. for 2 minutes followed by rinsing with DI water for 1 minute. The copper plated laminates were then rinsed with cold water for 2 minutes. Each copper plated laminate was then rinsed with deionized water for one minute. The laminates were then placed in a conventional laboratory convection oven and dried for 15 minutes at 100° C. After drying each copper plated laminate was placed in a conventional laboratory dessicator for 25 minutes or until it cooled to room temperature. The appearance of the copper deposits was then inspected and all had a salmon pink appearance.

European Backlight analysis was done for each laminate. Each laminate was cross-sectioned nearest to the centers of the through-holes to expose the copper plated walls. The cross-sections, no more than 3 mm thick from the center of the through-holes, were taken from each panel to determine the through-hole wall coverage. The cross-sections from each panel were placed under a conventional optical microscope of 50× magnification with a light source behind the samples. The quality of the copper deposits was determined by the amount of light visible under the microscope that was transmitted through the sample. The average backlight value for the totality of the samples was 4.8. This formulation which included both 2,2-dimethoxyacetaldehyde and sodium hypophosphite as reducing agents, 2,2'-dipyridyl and 2-mercaptobenzothiazole showed further improvement in electroless copper plating performance.

Example 6

Unclad epoxy/glass laminates with dimensions of 1 cm×5.7 cm provided by Sheng Yi (S1141) were used in plating tests for deposition rate measurement and coverage examination. Each laminate was treated as follows:
1. The surface of each laminate was immersed in an aqueous bath containing 3% CIRCUPOSIT™ CONDITIONER 231 formulation for 5 minutes at 40° C.
2. Each laminate was then rinsed with cold water for 2 minutes at 22° C.
3. CATAPOSIT™ 404 pre-dip was then applied to each laminate for 1 minute at room temperature.
4. The laminates were then activated for 5 minutes at 40° C. with a 2% CATAPOSIT™ 44 and CATAPOSIT™ 404 palladium/tin catalyst bath for electroless copper metallization.
5. The laminates were then rinsed with cold water for 2 minutes.
6. Each laminate was then immersed in an aqueous electroless copper plating composition of formulation H: 1.9 g/L copper ions from copper chloride dihydrate (5.6 g/L), 3.33 equivalents of ethylenediaminetetraacetic acid tetrasodium salt dihydrate (32 g/L), 0.1M 2,2-dimethoxyacetaldehyde (60 wt % aqueous) (10.8 g/L) and sodium hydroxide to maintain pH=13.
7. Each laminate was copper plated for 15 minutes at either 35 or 55° C. with gentle agitation. Copper oxide formation was not observed at either temperature during copper deposition and the baths appeared stable.
8. Each copper plated laminate was then rinsed with cold water for 2 minutes.
9. Each copper plated laminate was then rinsed with deionized water for 1 minute.
10. Each copper plated laminate was then placed in a conventional laboratory convection oven and dried for 15 minutes at 70° C.
11. After drying each copper plated laminate was cooled and observed for the quality of the copper deposit. Each laminate had a salmon pink copper deposit.
12. The mass of copper deposited was determined by ICP analysis as follows: A portion of the coupon was weighed and the copper was etched from each laminate by immersion in a mixture of concentrated nitric and hydrochloric acid (1:1 v/v). After heating at 60° C. for 30 minutes, the laminate was removed, and the resulting clear blue copper (II) solution was diluted to 10 mL. The prepared solution was analyzed using ICP emission spectrometry using a Perkin Elmer 7300 DV ICP optical emission spectrometer.
13. The copper deposition rate was calculated with the following formula: (X µg Cu/g laminate) $(0.1493$ g laminate/cm$^2)(10^{-6})](10^4)(1/8.94$ g/cm$^3)$ in units of µm/(plating time) where X=mass copper per mass coupon as determined by ICP. The surface area of a given mass of Sheng Yi (S1141) was determined experimentally to be 0.1493 g/cm$^2$, 8.94 g/cm$^3$ was the density of copper and $10^{-6}$ was the conversion factor of µg to g and $10^4$ was the conversion factor of cm to µm.

TABLE 7

| Formulation | Temperature ° C. | 15 Minute Plating Thickness in µm |
|---|---|---|
| H | 35 | 0.31 |
| H | 55 | 1.37 |

What is claimed is:
1. A method comprising:
   a) providing a substrate;
   b) applying an electroless copper plating composition to the substrate, the electroless copper plating composition comprises one or more sources of copper ions, one or more chelating agents and one or more compounds chosen from 2,2-dimethoxyacetaldehyde, 2,2-diethoxyacetaldehyde, 2,2-dipropoxyacetaldehyde and 2,2-dibutoxyacetaldehyde; and
   c) electroless plating copper on the substrate with the electroless copper plating composition.
2. The method of claim 1, wherein the substrate comprises a plurality of through-holes and further comprising:
   d) desmearing the through-holes; and
   e) plating copper on walls of the through-holes with the electroless copper plating composition.
3. The method of claim 2, wherein the substrate is a printed circuit board.

4. The method of claim 1, wherein the electroless copper plating composition is free of environmentally unfriendly reducing agents.

5. The method of claim 1, wherein the one or more compounds are in amounts of 1 g/L to 50 g/L.

6. The method of claim 5, wherein the one or more compounds are in amounts of 5 g/L to 30 g/L.

* * * * *